(12) United States Patent
Huang et al.

(10) Patent No.: US 10,770,368 B2
(45) Date of Patent: *Sep. 8, 2020

(54) CHIP ON FILM PACKAGE AND HEAT-DISSIPATION STRUCTURE FOR A CHIP PACKAGE

(71) Applicant: Novatek Microelectronics Corp., Hsinchu (TW)

(72) Inventors: Wen-Ching Huang, Hsinchu (TW); Tai-Hung Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/055,183

(22) Filed: Aug. 6, 2018

(65) Prior Publication Data

US 2018/0342437 A1 Nov. 29, 2018

Related U.S. Application Data

(63) Continuation-in-part of application No. 15/336,821, filed on Oct. 28, 2016, now Pat. No. 10,043,737.
(Continued)

(51) Int. Cl.
*H01L 23/29* (2006.01)
*H01L 23/367* (2006.01)
*H01L 23/373* (2006.01)
*H01L 23/00* (2006.01)
(Continued)

(52) U.S. Cl.
CPC ........ *H01L 23/367* (2013.01); *H01L 21/4882* (2013.01); *H01L 23/3672* (2013.01);
(Continued)

(58) Field of Classification Search
CPC ... H01L 21/563; H01L 21/56; H01L 23/4951; H01L 23/49562; H01L 23/49572
(Continued)

(56) References Cited

U.S. PATENT DOCUMENTS 5,561,323 A 10/1996 Andros et al.
10,043,737 B2 * 8/2018 Huang ................ H01L 23/3164
(Continued)

FOREIGN PATENT DOCUMENTS

CN 1215920 5/1999
CN 101114623 1/2008
(Continued)

OTHER PUBLICATIONS

"Office Action of China Counterpart Application," dated Aug. 1, 2018, pp. 1-9.

*Primary Examiner* — Theresa T Doan
(74) *Attorney, Agent, or Firm* — JCIPRNET (57) ABSTRACT

A chip on film package includes a base film, a chip and a heat-dissipation structure. The base film includes a first surface and a second surface opposite to the first surface. The chip is disposed on the first surface and has a chip length along a first axis of the chip and a chip width along a second axis of the chip perpendicular to the first axis. The heat-dissipation structure includes a covering portion. The covering portion at least partially covers the chip, exposes a side surface of the chip, and has a first length along the first axis and a second length along the second axis being longer than the chip width of the chip. The side surface connects a top surface and a bottom surface of the chip. A heat-dissipation structure is also provided.

39 Claims, 5 Drawing Sheets

Related U.S. Application Data (60) Provisional application No. 62/261,873, filed on Dec. 2, 2015.

(51) Int. Cl.
  *H01L 23/495* (2006.01)
  *H01L 21/48* (2006.01)

(52) U.S. Cl.
  CPC ...... *H01L 23/3675* (2013.01); *H01L 23/3736* (2013.01); *H01L 23/49568* (2013.01); *H01L 23/49572* (2013.01); *H01L 24/17* (2013.01); *H01L 24/16* (2013.01); *H01L 2224/16227* (2013.01); *H01L 2924/1611* (2013.01); *H01L 2924/1617* (2013.01)

(58) Field of Classification Search
  USPC .......................................................... 257/788
  See application file for complete search history.

(56) References Cited

U.S. PATENT DOCUMENTS

| | | | |
|---|---|---|---|
| 2007/0138614 A1 | 6/2007 | Harrison et al. | |
| 2008/0023822 A1* | 1/2008 | Lee | H01L 23/49838 257/702 |
| 2009/0273076 A1 | 11/2009 | Choi et al. | |
| 2012/0241942 A1* | 9/2012 | Ihara | H01L 24/73 257/712 |

FOREIGN PATENT DOCUMENTS

| | | |
|---|---|---|
| CN | 101261970 | 9/2008 |
| CN | 102543907 | 7/2012 |
| CN | 202750392 | 2/2013 |
| JP | 2000101220 | 4/2000 |

* cited by examiner

CHIP ON FILM PACKAGE AND HEAT-DISSIPATION STRUCTURE FOR A CHIP PACKAGE

CROSS-REFERENCE TO RELATED APPLICATION

This is a continuation-in-part application of U.S. application Ser. No. 15/336,821, filed on Oct. 28, 2016, now allowed, which claims the priority benefits of U.S. provisional application Ser. No. 62/261,873, filed on Dec. 2, 2015. The entirety of each of the above-mentioned patent applications is hereby incorporated by reference herein and made a part of this specification.

BACKGROUND

Technical Field

The present disclosure generally relates to a chip package and a heat-dissipation structure. More particularly, the present disclosure relates to a chip on film package and a heat-dissipation structure for a chip package.

Description of Related Art

In semiconductor production, the manufacturing of integrated circuits (IC) can be divided into three different stages, namely, a wafer fabrication stage, an integrated circuit fabrication stage and an IC packaging stage such as applying a chip-on-film (COF) package.

To increase the dissipation of heat from a chip of a COF package, a heat dissipation sheet is normally attached to a top surface of the base film to cover the whole chip or attached to a bottom surface of the base film opposite to the chip using thermal conductive glue after the chip is electrically connected to the film via bumps. Conventionally, during the process of attaching the heat dissipation sheet on the film for covering the chip, it is hard to make the heat dissipation sheet and the chip tightly attached together, so air gap usually exists between the chip and the heat dissipation sheet. As such, the air trapped between the chip and the heat dissipation sheet would expand during the subsequent thermal process, which may cause the heat dissipation sheet separating from the chip and reduce the reliability of the chip package. Moreover, since the heat conductivity of air is rather low, the air trapped in the space between the chip and the heat dissipation sheet would also affect the efficiency for heat generated from the chip to be conducted to the heat dissipation sheet.

SUMMARY

Accordingly, the present disclosure is directed to a chip on film package with favourable heat dissipation efficiency.

Accordingly, the present disclosure is further directed to a heat-dissipation structure for a chip package providing favourable heat dissipation efficiency to the chip package.

The present disclosure provides a chip on film package includes a base film, a chip and a first heat-dissipation structure. The base film includes a first surface and a second surface opposite to the first surface. The chip is disposed on the first surface and has a chip length along a first axis of the chip and a chip width along a second axis of the chip perpendicular to the first axis. The heat-dissipation structure includes a covering portion. The covering portion at least partially covers the chip, exposes a side surface of the chip, and has a first length along the first axis and a second length along the second axis being longer than the chip width of the chip. The side surface connects a top surface and a bottom surface of the chip.

The present disclosure provides a chip on film package including a base film, a chip, and a heat-dissipation structure. The base film includes a first surface and a second surface opposite to the first surface. The chip is disposed on the first surface of the base film and includes a top surface and a bottom surface connected to the first surface of the base film and opposite to the top surface. The heat-dissipation structure is disposed on the base film and includes a protection layer, a heat-dissipation layer and a first adhesive layer disposed between an attaching surface of the protection layer and the heat-dissipation layer, wherein a contour line of the first adhesive layer does not exceed a contour line of the protection layer.

The present disclosure provides a heat-dissipation structure for a chip package including a covering portion. The covering portion is configured for at least partially covering a chip of the chip package and exposing a side surface of the chip, wherein the covering portion has a first length along a first axis of the chip and a second length along a second axis of the chip being longer than a chip width of the chip along the second axis, and the side surface connects a top surface and a bottom surface of the chip and the second axis is perpendicular to the first axis.

The present disclosure further provides a heat-dissipation structure for a chip package including a protection layer, a heat-dissipation layer and a first adhesive layer disposed between an attaching surface of the protection layer and the heat-dissipation layer, wherein a protection distance maintains between a contour line of the protection layer and a contour line of the first adhesive layer.

In light of the foregoing, in the present disclosure, the chip on film package utilizes the heat-dissipation structure including a covering portion, wherein the covering portion covers the chip and exposes a side surface of the chip. With such configuration, the air between the chip and the heat-dissipation structure can be easily discharged since the covering portion of the heat-dissipation structure does not completely enclose the chip but actually exposes the side surface of the chip. As such, the heat-dissipation structure would not be deformed or even separated from the chip during subsequent thermal process, so as to improve the reliability of the chip on film package.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Reference will now be made in detail to the present preferred embodiments of the disclosure, examples of which are illustrated in the accompanying drawings. Wherever possible, the same reference numbers are used in the drawings and the description to refer to the same or like parts.

Figure 1A:
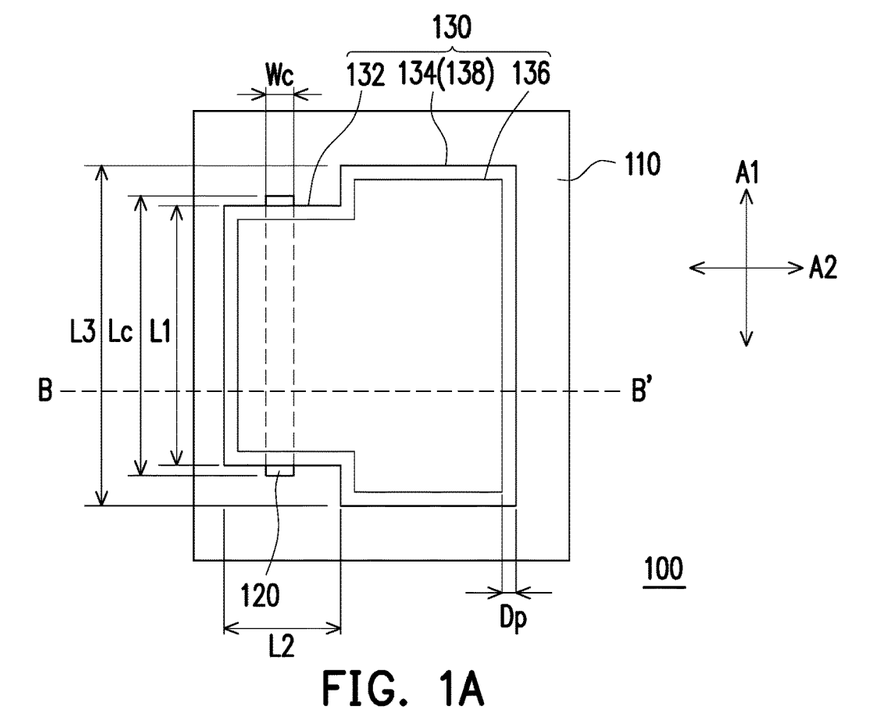
FIG. 1A illustrates a top view of a chip on film package according to an embodiment of the disclosure.
Figure 1B:
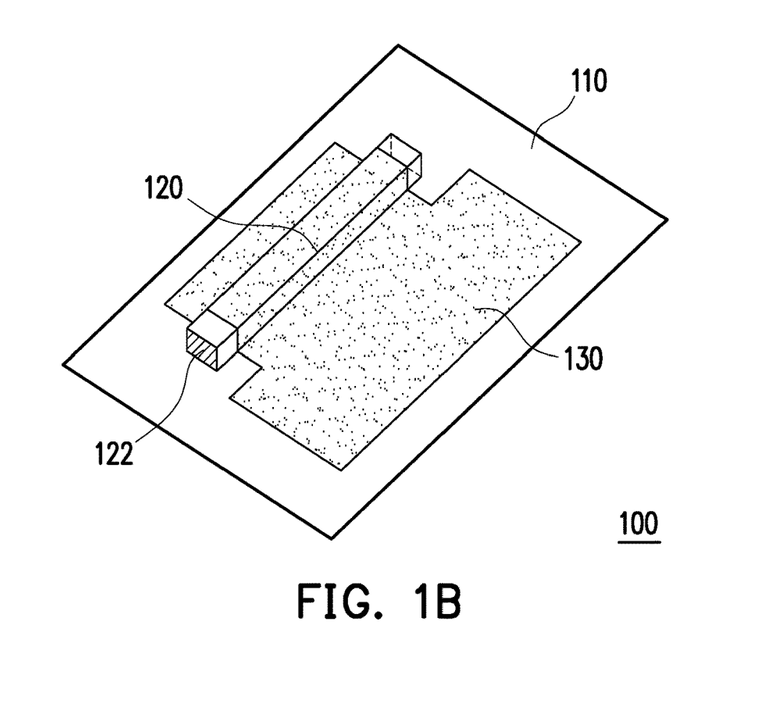
FIG. 1B illustrates a perspective view of the chip on film package of FIG. 1A.
Figure 5:
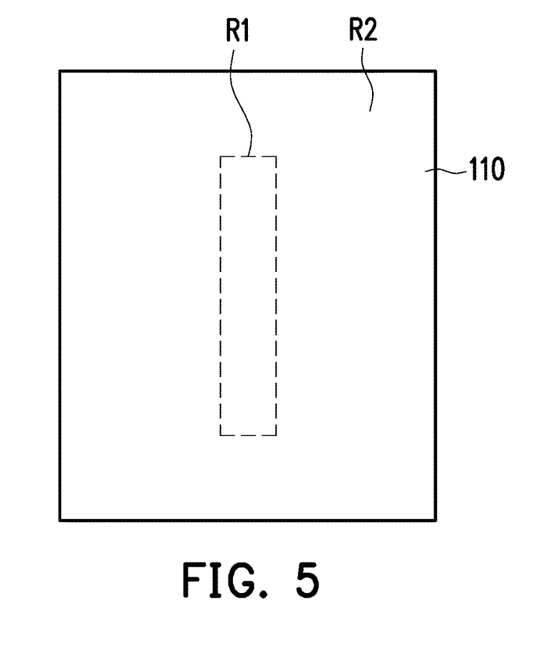
FIG. 5 illustrates a top view of a base film of a chip on film package according to an embodiment of the disclosure.
Figure 6:
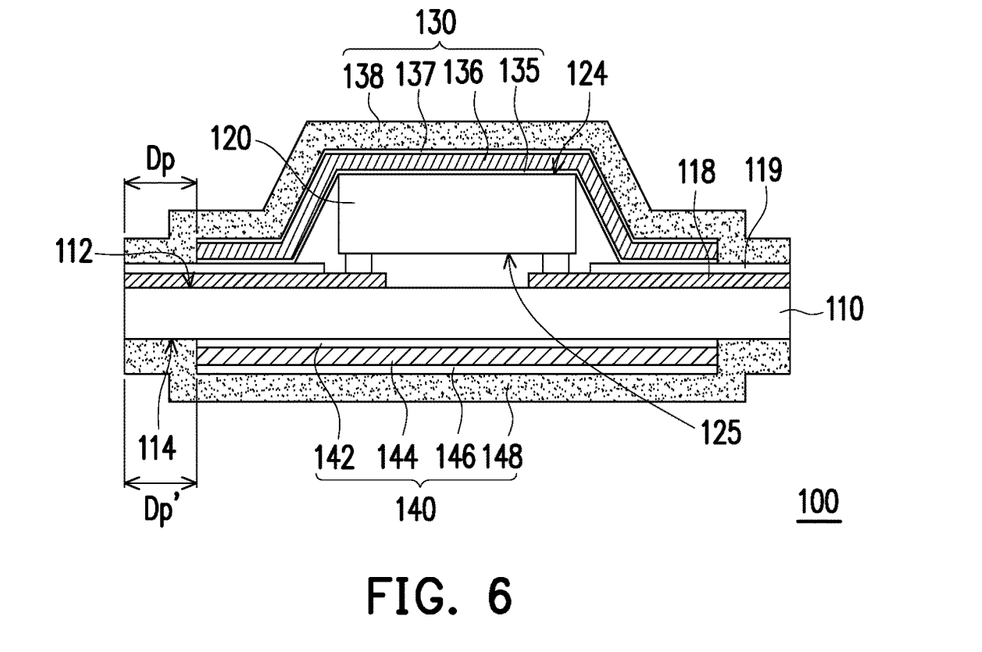
FIG. 6 illustrates a cross sectional view of a chip on film package according to an embodiment of the disclosure.

FIG. 1A illustrates a top view of a chip on film package according to an embodiment of the disclosure. FIG. 1B illustrates a perspective view of the chip on film package of FIG. 1A. FIG. 5 illustrates a top view of a base film of a chip on film package according to an embodiment of the disclosure. FIG. 6 illustrates a cross sectional view of a chip on film package according to an embodiment of the disclosure, the cross sectional view of the chip on film package 100 in FIG. 1A along a line B-B'. Referring to FIG. 1A, FIG. 1B, FIG. 5 and FIG. 6, in the present embodiment, a heat-dissipation structure 130/140 may be applied to a chip package such as a chip on film (COF) package or a chip on plastic package (COP), or the like. In the embodiment of the heat-dissipation structure 130/140 being applied to the chip on plastic package, the heat-dissipation structure 130/140 may be attached to a flexible plastic substrate where the chip is mounted and cover the at least a part of the chip. In the present embodiment, the chip package is a chip on film package 100, but the disclosure is not limited thereto. In some embodiments, the chip on film package 100 includes a base film 110, a chip 120 and the heat-dissipation structure 130. The base film 110 includes a first surface 112 and a second surface 114 opposite to the first surface 112. The chip 120 is disposed on the first surface 112 and has a chip length Lc along a first axis A1 of the chip 120, wherein the first axis A1 may be the longitudinal axis of the chip 120, but the present disclosure is not limited thereto. In the present embodiment, the base film 110 may further include a patterned circuit layer 118 and a solder resist layer 119. The patterned circuit layer 118 is disposed on the first surface 112 of the base film 110. The solder resist layer 119 covers the patterned circuit layer 118 and exposes a part of the patterned circuit layer 118, such that the chip 120 is electrically connected to the patterned circuit layer 118 exposed by the solder resist layer 119.

The heat-dissipation structure 130 includes a covering portion 132. The covering portion 132 at least partially covers the chip 120 and is attached to the base film 110. A filling material such as resin may be filled between the chip 120, the base film 110 and the heat-dissipation structure 130 to further fix the position of the chip 120. The covering portion 132 has a first length L1 (recited as length L1 hereinafter) along the first axis A1, and a second length L2 (recited as length L2 hereinafter) along the second axis A2. In the present embodiment, the second length L2 is longer than the chip width Wc of the chip 120. In the present embodiment, the chip length Lc is substantially greater than the chip width Wc. In some embodiments, the heat-dissipation structure 130 may further include a first extending portion 134 as shown in FIG. 1A. The first extending portion 134 is connected to the covering portion 132 and attached to first surface 112 of the base film 110. The first extending portion 134 has a third length L3 (recited as length L3 hereinafter) along the first axis A1, and the length L3 of first extending portion 134 is substantially longer than the length L1 of the covering portion 132, and the covering portion 132 exposes a side surface 122 of the chip 120 as shown in FIG. 1B. In the present embodiment, the side surface 122 of the chip 120 connects a top surface 124 and a bottom surface 125 of the chip 120 as shown in FIG. 6.

With such configuration, the air and/or moisture in the space between the chip 120 and the heat-dissipation structure 130 can be easily discharged since the covering portion 132 of the heat-dissipation structure 130 does not completely enclose the chip 120 but exposes the side surface 122 of the chip 120. As such, the heat-dissipation structure 130 would not be deformed or even separated from the chip 120 under high temperature and/or high humidity condition, so as to improve the reliability of the chip on film package.

In some embodiments, the length L1 of the covering portion 132 is substantially equal to or shorter than the chip length Lc. In the present embodiment, the length L1 of the covering portion 132 is shorter than the chip length Lc as shown in FIG. 1A, such that the covering portion 132 exposes a part of the top surface 124 and the side surface 122 of the chip 120. In other embodiment, the length L1 of the covering portion 132 may be substantially equal to the chip length Lc. Namely, an edge of the covering portion 132 is aligned with an edge of the chip 120, such that the covering portion 132 exposes the side surface 122 of the chip 120. The base film 110 includes a central region R1 and a peripheral region R2 surrounding the central region R1 as shown in FIG. 5. In the present embodiment, the chip 120 is disposed on the peripheral region R2 of the base film 110. The heat-dissipation structure 130 covers the chip 120 with its covering portion 132 and is attached to the base film 110 with its first extending portion 134. It should be noted that the orientation terminology such as the central region R1 and the peripheral region R2 mentioned above are relative terms, and the central region R1 is not necessarily located at the center of the base film 110. The components of the disclosure can be positioned in a number of different orientations. As such, the orientation terminology is used for purposes of illustration and is in no way limiting.

In detail, the heat-dissipation structure 130 may further include a first adhesive layer 137, a heat-dissipation layer 136, a second adhesive layer 135 and a protection layer 138 as shown in FIG. 6, wherein the heat-dissipation layer 136 is attached to the base film 110 and the chip 120 by the second adhesive layer 135, the protection layer 138 completely covers the heat-dissipation layer 136, and the first adhesive layer 137 is formed on an attaching surface of the protection layer 138 and adhered to the heat-dissipation layer 136. In other words, the first adhesive layer 137 is disposed between the attaching surface of the protection layer 138 and the heat-dissipation layer 136. In the present embodiment, the protection layer 138 may include an insulating film, and the heat-dissipation layer 136 may include a metal foil or a graphite film, but the disclosure is not limited thereto.

In the present embodiment, a size of the heat-dissipation layer 136, a size of the first adhesive layer 137 and a size of the second adhesive layer 135 are substantially identical, and a size of the protection layer 138 is greater than the size of the heat-dissipation layer 136, the first adhesive layer 137 and the second adhesive layer 135 as shown in FIG. 6. Thus, a protection distance maintains between a contour line of the protection layer 138 and a contour line of the heat-dissipation layer 136 as shown in FIG. 6. Namely, heat-dissipation layer 136 exposes a boundary region of the protection layer 138. The size of the protection layer 138 is greater than a size of the first adhesive layer 137, and a protection distance Dp maintains between the contour line of the protection layer 138 and a contour line of the first adhesive layer 137 as shown in FIG. 6. Namely, the protection layer 138 includes a boundary region surrounding a boundary of the attaching surface of the protection layer 138, and the first adhesive layer 137 exposes the boundary region of the protection layer 138. As such, the issue of adhesive (e.g. first adhesive layer 137 and/or second adhesive layer 135) overflow when the heat dissipation structure 130 is pressed to be attached to the base film 110 can be avoided. It is noted that the heat-dissipation structure 130 in FIG. 6 is illustrated as it is a component before applied to the chip on film package assembly, and the heat-dissipation structure 130 illustrated in FIG. 6 may be not in the actual status of the heat-dissipation structure 130 after it is pressed and attached to the base film 110. In the actual status, the protection distance Dp may be reduced or even diminished after the pressing process of the heat dissipation structure 130 since the adhesive (e.g., first adhesive layer 137 and/or second adhesive layer 135) may be more spread out after the pressing process. After the pressing process of the heat dissipation structure 130, the contour line of the first adhesive layer 137 or the second adhesive layer 135 may exceed the contour line of the heat-dissipation layer 136, and the contour line of the first adhesive layer 137 or the second adhesive layer 135 does not exceed the contour line of the protection layer 138, such that the adhesive overflow is avoided.

In addition, the chip on film package 100 may further include a second heat-dissipation structure 140 disposed on a second surface 114 of the base film 110 as shown in FIG. 6. The structure of the second heat-dissipation structure 140 may be the same or at least similar to the structure of the heat-dissipation structure 130. For purpose of clarity and simplicity, detail description of same or similar features may be omitted, and the similar reference numbers denote the same or similar components. Namely, the second heat-dissipation structure 140 may also include a protection layer 148, a first adhesive layer 146, a heat-dissipation layer 144, and a second adhesive layer 142 as shown in FIG. 6, wherein the heat-dissipation layer 144 is attached to the second surface 114 of the base film 110 by the second adhesive layer 142, the protection layer 148 completely covers the heat-dissipation layer 144, and the first adhesive layer 146 is formed on an attaching surface of the protection layer 148 and adhered to the heat-dissipation layer 144.

A size of the first adhesive layer 137, a size of the second adhesive layer 135 and a size of the heat-dissipation layer 136 are substantially identical, and a size of the protection layer 148 is greater than the size of the heat-dissipation layer 144, the first adhesive layer 146 and the second adhesive layer 142. Therefore, a protection distance maintains between a contour line of the protection layer 148 and a contour line of the heat-dissipation layer 144 as shown in FIG. 6. The size of the protection layer 148 is greater than the size of the first adhesive layer 146, and a protection distance Dp' maintains between the contour line of the protection layer 148 and a contour line of the first adhesive layer 146, such that the first adhesive layer 146 exposes the boundary region of the protection layer 148. As such, the issue of adhesive overflow when the second heat dissipation structure 140 is pressed to be attached to the base film 110 can be avoided. Similarly, the second heat-dissipation structure 140 in FIG. 6 is illustrated as it is a component before applied to the chip on film package assembly, and the second heat-dissipation structure 140 in FIG. 6 may be not in the actual status of the second heat-dissipation structure 140 after it is pressed to be attached to the base film 110. In the actual status, the protection distance Dp' may be reduced or even diminished after the pressing process of the second heat dissipation structure 140 since the adhesive (e.g., first adhesive layer 146 and/or second adhesive layer 142) may be more spread out after the pressing process. After the pressing process of the second heat dissipation structure 140, the contour line of the first adhesive layer 146 or the second adhesive layer 142 may exceed the contour line of the heat-dissipation layer 144, and the contour line of the first adhesive layer 146 or the second adhesive layer 142 does not exceed the contour line of the protection layer 148, such that the adhesive overflow is avoided. In some embodiments, the protection distance Dp' between the protection layer 138 and the first adhesive layer 137 of the heat-dissipation structure 130 may be the same as or different from the protection distance Dp' between the protection layer 148 and the first adhesive layer 146 of the second heat-dissipation structure 140.

Figure 2A:
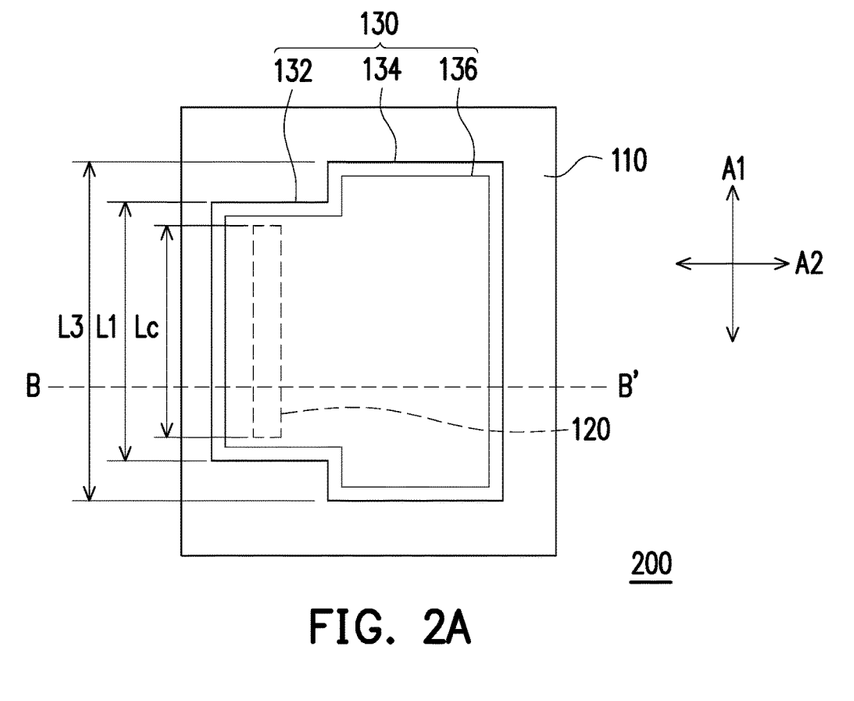
FIG. 2A illustrates a top view of a chip on film package according to another embodiment of the disclosure.
Figure 2B:
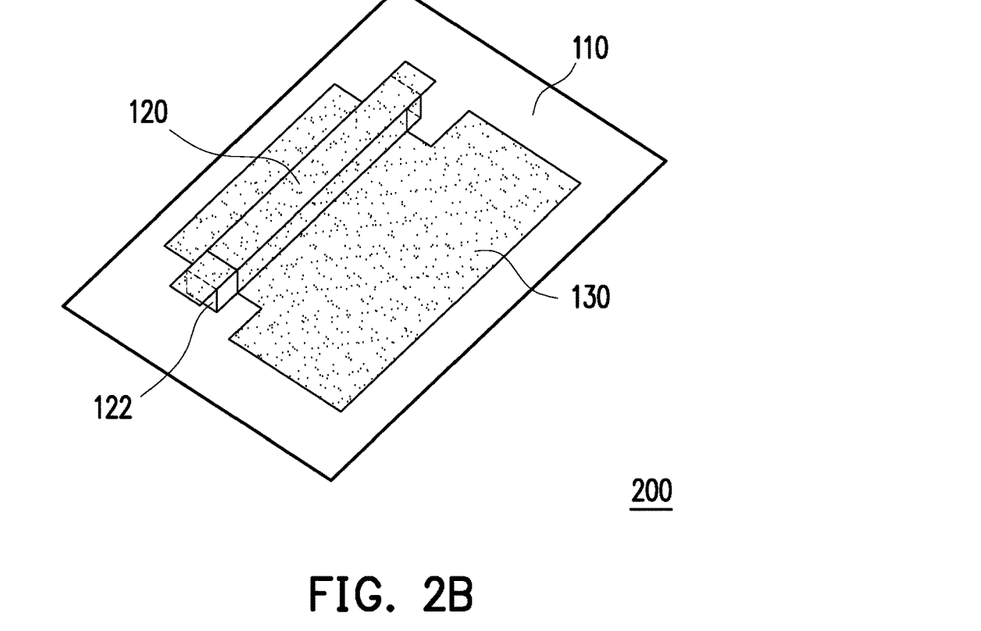
FIG. 2B illustrates a perspective view of the chip on film package of FIG. 2A.

FIG. 2A illustrates a top view of a chip on film package according to another embodiment of the disclosure. It is noted that a chip on film package 200 shown in FIG. 2A contains many features same as or similar to the chip on film package 100 disclosed earlier with FIG. 1A. FIG. 2B illustrates a perspective view of the chip on film package 200 of FIG. 2A. A cross sectional view of the chip on film package 200 alone a line B-B' is similar to FIG. 6. For purpose of clarity and simplicity, detail description of same or similar features may be omitted, and the same reference numbers denote the same or similar components. The main differences between the chip on film package 200 shown in FIG. 2A and the chip on film package 100 shown in FIG. 1A are described as follows.

In the present embodiment, the length L1 of the covering portion 132 is substantially longer than the chip length Lc as shown in FIG. 2A. As such, the covering portion 132 is cantilevered over the top surface 124 of the chip 120 to expose the side surface 122 of the chip 120 as shown in FIG. 2B. It is shown that the disclosure does not limit the length L1 of the covering portion 132 along the first axis A1 as long as the covering portion 132 exposes the side surface 122 of the chip 120.

Figure 3:
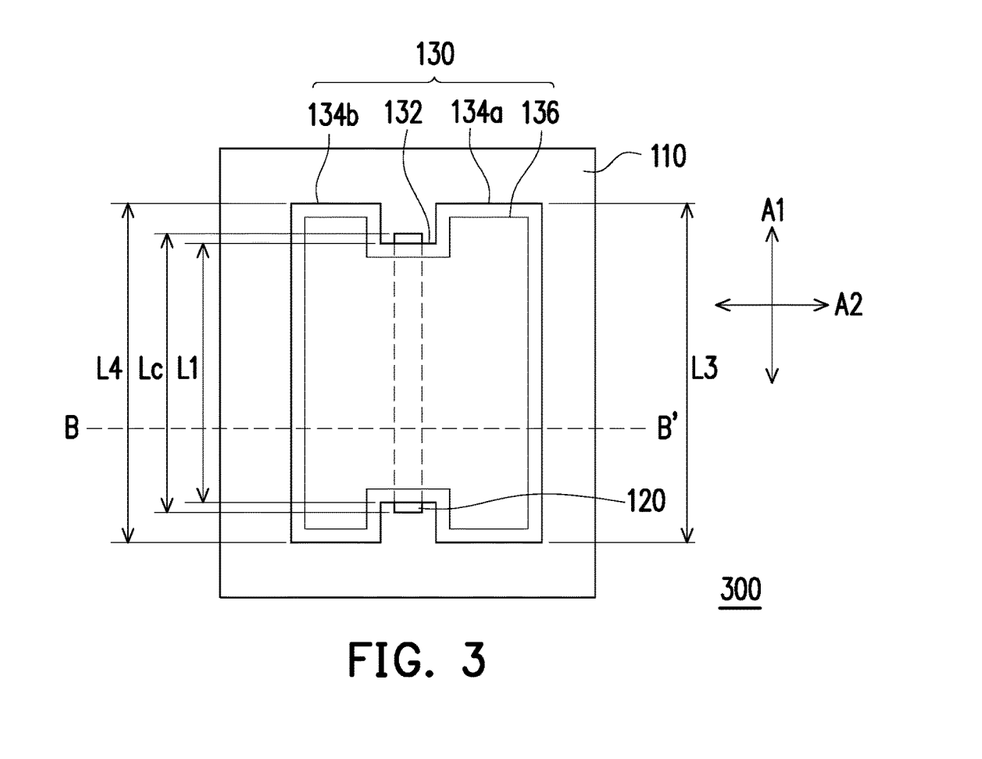
FIG. 3 illustrates a top view of a chip on film package according to yet another embodiment of the disclosure.

FIG. 3 illustrates a top view of a chip on film package according to yet another embodiment of the disclosure. It is noted that a chip on film package 300 shown in FIG. 3 contains many features same as or similar to the chip on film package 100 disclosed earlier with FIG. 1A. A cross sectional view of the chip on film package 300 alone a line B-B' is similar to FIG. 6. For purpose of clarity and simplicity, detail description of same or similar features may be omitted, and the same reference numbers denote the same or similar components. The main differences between the chip on film package 300 shown in FIG. 3 and the chip on film package 100 shown in FIG. 1A are described as follows.

In the present embodiment, the chip 120 is disposed on a central region (for example, the central region R1 shown in FIG. 5) of the base film 110. With this configuration, the heat-dissipation structure 130 may include a first extending portion 134a and a second extending portion 134b, and both of the first extending portion 134a and the second extending portion 134b are attached to the base film 110. The covering portion 132 is connected between the first extending portion 134a and the second extending portion 134b. Namely, the first extending portion 134a and the second extending portion 134b are respectively connected two opposite sides of the covering portion 132 along a second axis A2 perpendicular to the first axis A1. In some embodiments, the first extending portion 134a has a third length L3 along the first axis A1, and a second extending portion 134b having a fourth length L4 along the first axis A1. The third length L3 of the first extending portion 134a and the fourth length L4 of the second extending portion 134b are both substantially longer than the first length L1 of the covering portion 132 as it is shown in FIG. 3.

In some embodiments, the covering portion 132 and the extending portion 134 (the first extending portion 134a and the second extending portion 134b) may be integrally formed. That is to say, the heat-dissipation structure 130 may be an integral heat-dissipation sheet.

Figure 1C:
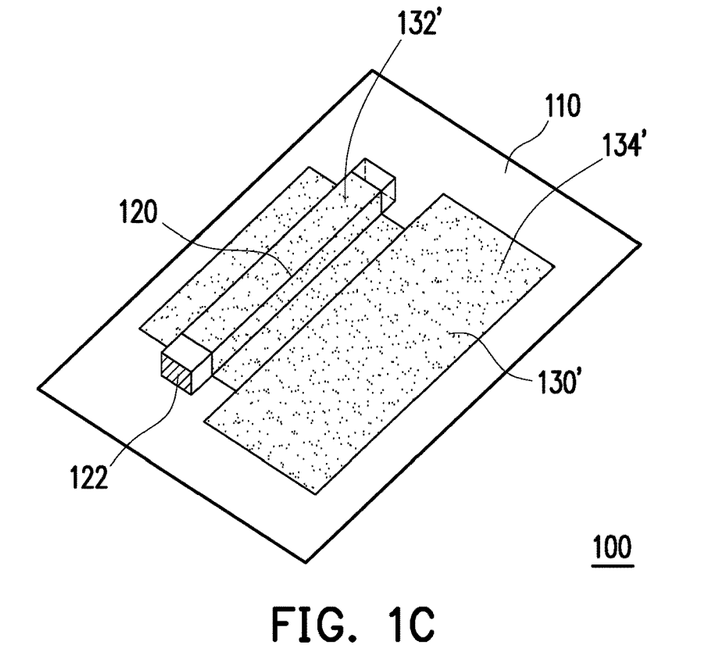
FIG. 1C illustrates a perspective view of a chip on film package according to an embodiment of the disclosure.

FIG. 1C illustrates a perspective view of a chip on film package according to an embodiment of the disclosure. In other embodiments, referring to FIG. 1C, the heat-dissipation structure 130' may be formed by assembling a plurality of heat-dissipation sheets together. For example, each of the covering portion 132' and the extending portion 134' (or the first extending portion 134a and the second extending portion 134b) may be an individual heat-dissipation sheet, and these heat-dissipation sheets (e.g. the covering portion 132' and the extending portion 134') are attached on the base film 110 and covers a part of the chip 120. In some embodiment, the covering portion 132' and the extending portion 134' may be partially overlapped with one another to be attached together and form the heat-dissipation structure 130' as a whole. Such arrangement may be also applied to the heat-dissipation structures 130 shown in FIG. 2A to FIG. 4.

In some embodiments, the length L1 of the covering portion 132 is substantially equal to or shorter than the chip length Lc of the chip 120. In the present embodiment, the length L1 of the covering portion 132 is shorter than the chip length Lc of the chip 120, such that the covering portion 132 exposes a part of the top surface 124 and the side surface 122 of the chip 120. Certainly, in other embodiment, the length L1 of the covering portion 132 may be substantially equal to the chip length Lc of the chip 120, such that the covering portion 132 exposes the side surface 122 of the chip 120. Namely, an edge of the covering portion 132 is aligned with an edge of the chip 120, so the covering portion 132 exposes the side surface 122 of the chip 120.

Figure 4:
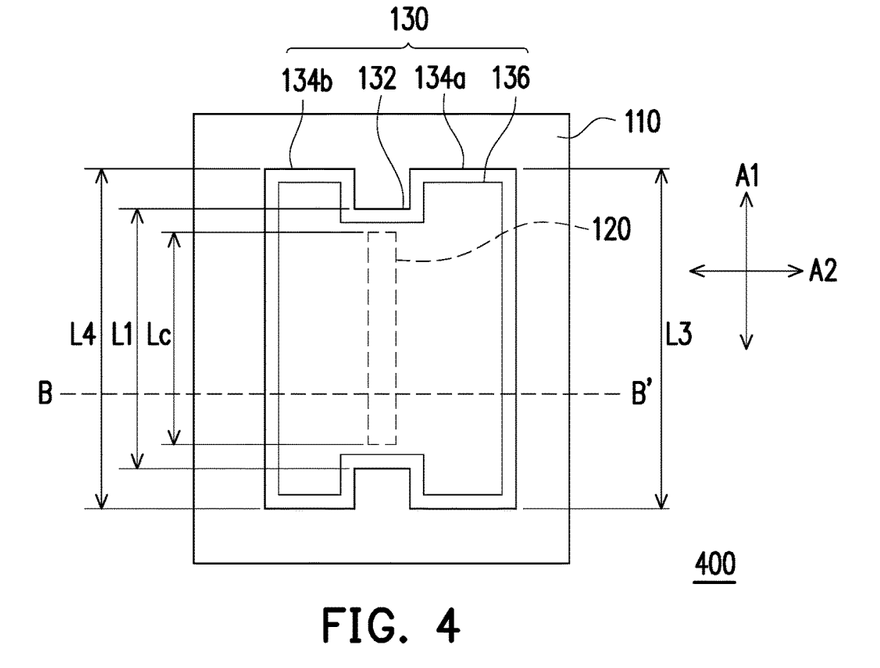
FIG. 4 illustrates a top view of a chip on film package according to yet another embodiment of the disclosure.

FIG. 4 illustrates a top view of a chip on film package according to yet another embodiment of the disclosure. It is noted that a chip on film package 400 shown in FIG. 4 contains many features same as or similar to the chip on film package 100 disclosed earlier with FIG. 3. A cross sectional view of the chip on film package 400 alone a line B-B' is similar to FIG. 6. For purpose of clarity and simplicity, detail description of same or similar features may be omitted, and the same reference numbers denote the same or similar components. The main differences between the chip on film package 400 shown in FIG. 4 and the chip on film package 100 shown in FIG. 3 are described as follows.

In the present embodiment, the length L1 of the covering portion 132 is substantially longer than the chip length Lc of the chip 120 as shown in FIG. 4. As such, the covering portion 132 is cantilevered over the top surface 124 of the chip 120 to expose the side surface 122 of the chip 120. It is shown that the disclosure does not limit the length L1 of the covering portion 132 along the first axis A1 as long as the covering portion 132 exposes the side surface 122 of the chip 120.

Figure 7:
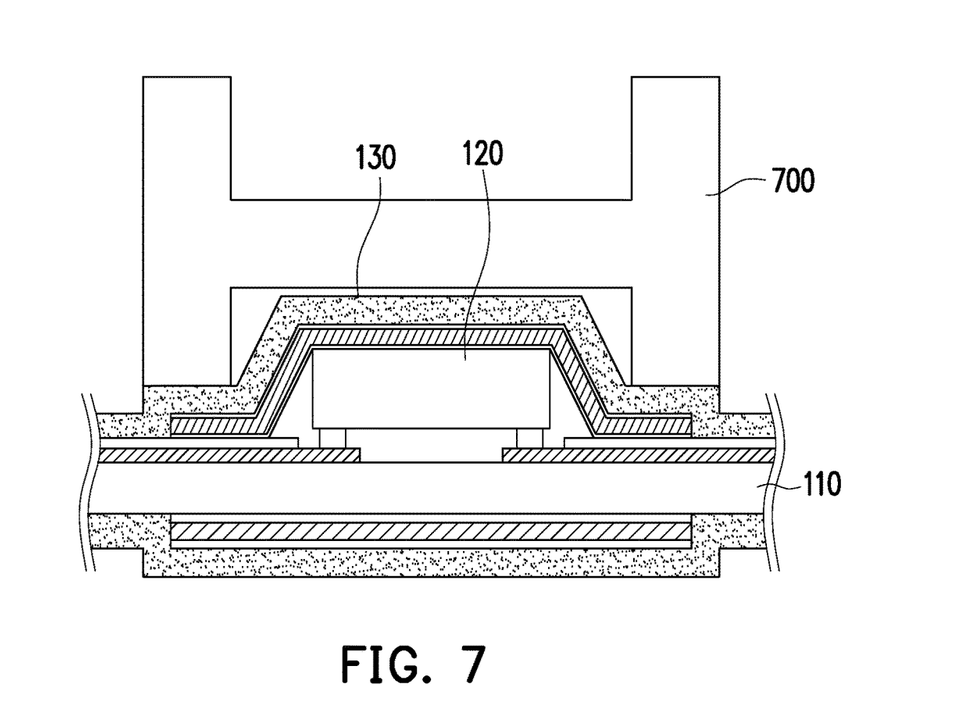
FIG. 7 illustrates an elevation view of a chip on film package and a fixture for attaching a heat-dissipation structure according to an embodiment of the disclosure.

FIG. 7 illustrates an elevation view of a chip on film package (e.g., chip on film package 100, 200, 300, or 400) and a fixture for attaching a heat-dissipation structure according to an embodiment of the disclosure. Referring to FIG. 7, in the present embodiment, the heat dissipation structure 130 may be pressed and attached to the base film 110 by a fixture 700. The fixture 700 may be made of flexible material to avoid damaging the chip on film package. In the present embodiment, the fixture 700 includes a cavity corresponding to the location of the chip 120, so the cavity is configured to accommodate the chip 120 when the fixture 700 presses the heat dissipation structure 130 onto the base film 110. The fixture 700 may move (e.g., roll) from one side of the chip 120 to the other side of the chip 120 along the longitudinal axis to press the heat dissipation structure 130 to be attached on the base film 110 and cover the chip 120. In the present embodiment, a gap may exist between the cavity of the fixture 700 and the chip 120, and the gap may be in a range from 0.5 mm to 1 mm, but the disclosure is not limited thereto.

In sum, the chip on film package of the disclosure utilizes the heat-dissipation structure including a covering portion and at least one extending portion, wherein the covering portion covers the chip and exposes a side surface of the chip, and the extending portion connects the covering portion and is attached to the base film. With such configuration, the air and/or moisture in the space between the chip and the heat-dissipation structure can be easily discharged since the covering portion of the heat-dissipation structure does not completely enclose the chip but actually exposes the side surface of the chip. As such, the heat-dissipation structure would not be deformed or even separated from the chip under high temperature and/or high humidity condition, so as to improve the reliability of the chip on film package.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A chip on film package, comprising:
   a base film comprising a first surface and a second surface opposite to the first surface;
   a chip disposed on the first surface, having a top surface, a bottom surface, and a side surface connecting the top surface and the bottom surface and being perpendicular to the top surface and the bottom surface, and having a chip length along a first axis of the chip and a chip width along a second axis of the chip perpendicular to the first axis, wherein the first axis and the second axis define a plane parallel to the top surface and the bottom surface; and
   a first heat-dissipation structure comprising a covering portion, the covering portion at least partially covering the chip, exposing the side surface of the chip, and having a first length along the first axis and a second length along the second axis being longer than the chip width of the chip.

2. The chip on film package as claimed in claim 1, wherein the first heat-dissipation structure further comprises a first extending portion connected to one side of the covering portion and attached to the first surface of the base film, and having a third length along the first axis substantially longer than the first length of the covering portion.

3. The chip on film package as claimed in claim 2, wherein the first heat-dissipation structure further comprises a second extending portion having a fourth length along the first axis substantially longer than the first length of the covering portion, wherein the covering portion is connected between the first extending portion and the second extending portion.

4. The chip on film package as claimed in claim 1, wherein the first length of the covering portion is substantially equal to or shorter than the chip length, such that the covering portion exposes the side surface of the chip.

5. The chip on film package as claimed in claim 1, wherein the first length of the covering portion is substantially longer than the chip length, and the covering portion is cantilevered over the top surface of the chip to expose the side surface of the chip.

6. The chip on film package as claimed in claim 1, wherein the chip is disposed on a peripheral region of the base film.

7. The chip on film package as claimed in claim 1, wherein the chip is disposed at a central region of the base film.

8. The chip on film package as claimed in claim 1, wherein the first heat-dissipation structure comprises a heat-dissipation layer, a protection layer and a first adhesive layer disposed between an attaching surface of the protection layer and the heat-dissipation layer, wherein a protection distance maintains between a contour line of the protection layer and a contour line of the first adhesive layer.

9. The chip on film package as claimed in claim 8, wherein the first heat-dissipation structure further comprises a second adhesive layer, and the heat-dissipation layer is attached to the base film and the chip by the second adhesive layer.

10. The chip on film package as claimed in claim 1, further comprising a second heat-dissipation structure disposed on the second surface of the base film, wherein the second heat-dissipation structure comprises a heat-dissipation layer, a protection layer and a first adhesive layer disposed between an attaching surface of the protection layer and the heat-dissipation layer, and wherein a protection distance maintains between a contour line of the protection layer and a contour line of the first adhesive layer.

11. A chip on film package, comprising:
 a base film comprising a first surface and a second surface opposite to the first surface;
 a chip, disposed on the first surface of the base film, and comprising a top surface and a bottom surface connected to the first surface of the base film and opposite to the top surface; and
 a heat-dissipation structure comprising:
  a protection layer;
  a heat-dissipation layer; and
  a first adhesive layer disposed between an attaching surface of the protection layer and the heat-dissipation layer, wherein a contour line of the first adhesive layer does not exceed a contour line of the protection layer, wherein the heat dissipation structure is pressed to be attached to the base film during a process of attaching the heat dissipation structure.

12. The chip on film package as claimed in claim 11, where the heat-dissipation structure is attached to the first surface of the base film.

13. The chip on film package as claimed in claim 12, wherein the chip has a chip length along a first axis of the chip and a chip width along a second axis of the chip perpendicular to the first axis, and the heat-dissipation structure comprises a covering portion, the covering portion at least partially covering the chip, exposing a side surface of the chip which connects the top surface and the bottom surface of the chip, and having a first length along the first axis and a second length along the second axis being longer than the chip width of the chip.

14. The chip on film package as claimed in claim 13, wherein the heat-dissipation structure further comprises a first extending portion connected to the covering portion, attached to the first surface of the base film, and having a third length along the first axis substantially longer than the first length of the covering portion.

15. The chip on film package as claimed in claim 14, wherein the heat-dissipation structure further comprises a second extending portion, the covering portion is connected between the first extending portion and the second extending portion, and the second extending portion has a fourth length along the first axis substantially longer than the first length of the covering portion.

16. The chip on film package as claimed in claim 13, wherein the first length of the covering portion is substantially equal to or shorter than the chip length, such that the covering portion exposes the side surface of the chip.

17. The chip on film package as claimed in claim 13, wherein the first length of the covering portion is substantially longer than the chip length, and the covering portion is cantilevered over the top surface of the chip to expose the side surface of the chip.

18. The chip on film package as claimed in claim 11, wherein the heat-dissipation structure covers a projection area of the chip in the second surface of the base film.

19. A heat-dissipation structure for a chip package, comprising:
 a covering portion, configured for at least partially covering a chip of the chip package, exposing a side surface of the chip, and having a first length along a first axis of the chip and a second length along a second axis of the chip being longer than a chip width of the chip along the second axis, wherein the side surface connects a top surface and a bottom surface of the chip and is perpendicular to the top surface and the bottom surface, the second axis is perpendicular to the first axis, and the first axis and the second axis define a plane parallel to the top surface and the bottom surface.

20. The heat-dissipation structure as claimed in claim 19, further comprising a first extending portion connected to one side of the covering portion and attached to a first surface of a base substrate of the chip package, wherein the first extending portion has a third length along the first axis substantially longer than the first length of the covering portion.

21. The heat-dissipation structure as claimed in claim 20, further comprising a second extending portion having a fourth length along the first axis substantially longer than the first length of the covering portion, wherein the covering portion is connected between the first extending portion and the second extending portion.

22. The heat-dissipation structure as claimed in claim 19, wherein the first length of the covering portion is substantially equal to or shorter than a chip length of the chip along the first axis, such that the covering portion exposes the side surface of the chip.

23. The heat-dissipation structure as claimed in claim 19, wherein the first length of the covering portion is substantially longer than a chip length of the chip along the first axis, and the covering portion is cantilevered over the top surface of the chip to expose the side surface of the chip.

24. The heat-dissipation structure as claimed in claim 19, wherein the heat-dissipation structure comprises a heat-dissipation layer, a protection layer and a first adhesive layer disposed between an attaching surface of the protection layer and the heat-dissipation layer, wherein a protection distance maintains between a contour line of the protection layer and a contour line of the first adhesive layer.

25. The heat-dissipation structure as claimed in claim 24, wherein the heat-dissipation structure further comprises a second adhesive layer, and the heat-dissipation layer is configured to be attached to a base substrate of the chip package where the chip is mounted and the chip by the second adhesive layer.

26. The heat-dissipation structure as claimed in claim 24, wherein the heat-dissipation layer comprises a metal foil or a graphite film.

27. The heat-dissipation structure as claimed in claim 19, wherein the chip package is a chip on film package (COF).

28. The heat-dissipation structure as claimed in claim 19, wherein the chip package is a chip on plastic package (COP).

29. A heat-dissipation structure for a chip package, comprising:
a protection layer;
a heat-dissipation layer; and
a first adhesive layer disposed between an attaching surface of the protection layer and the heat-dissipation layer, wherein a protection distance maintains between the outmost contour line of the protection layer and the outmost contour line of the first adhesive layer,
wherein the heat dissipation structure is configured to be pressed to be attached to a base substrate of the chip package during a process of attaching the heat dissipation structure.

30. The heat-dissipation structure as claimed in claim 29, wherein the heat-dissipation structure is configured to be attached to a first surface of the base substrate of the chip package, and a chip of the chip package is disposed on the first surface.

31. The heat-dissipation structure as claimed in claim 30, wherein the chip has a chip length along a first axis of the chip and a chip width along a second axis of the chip perpendicular to the first axis, and the heat-dissipation structure comprises a covering portion, the covering portion at least partially covering the chip, exposing a side surface of the chip which connects a top surface and a bottom surface of the chip, and having a first length along the first axis and a second length along the second axis being longer than the chip width of the chip.

32. The heat-dissipation structure as claimed in claim 31, wherein the heat-dissipation structure further comprises a first extending portion connected to the covering portion, attached to the first surface of the base substrate, and having a third length along the first axis substantially longer than the first length of the covering portion.

33. The heat-dissipation structure as claimed in claim 32, wherein the heat-dissipation structure further comprises a second extending portion, the covering portion is connected between the first extending portion and the second extending portion, and the second extending portion has a fourth length along the first axis substantially longer than the first length of the covering portion.

34. The heat-dissipation structure as claimed in claim 31, wherein the first length of the covering portion is substantially equal to or shorter than the chip length, such that the covering portion exposes the side surface of the chip.

35. The heat-dissipation structure as claimed in claim 31, wherein the first length of the covering portion is substantially longer than the chip length, and the covering portion is cantilevered over the top surface of the chip to expose the side surface of the chip.

36. The heat-dissipation structure as claimed in claim 29, wherein the heat-dissipation structure is configured to be attached to a second surface of the base substrate of the chip package and to cover a projection area of a chip of the chip package in the second surface of the base substrate, and wherein the chip is disposed on a first surface of the base substrate opposite to the second surface.

37. The heat-dissipation structure as claimed in claim 29, wherein the heat-dissipation layer comprises a metal foil or a graphite film.

38. The heat-dissipation structure as claimed in claim 29, wherein the chip package is a chip on film package (COF).

39. The heat-dissipation structure as claimed in claim 29, wherein the chip package is a chip on plastic package (COP).

* * * * *